United States Patent
Bouillon et al.

(10) Patent No.: US 11,530,727 B2
(45) Date of Patent: Dec. 20, 2022

(54) PROCESS FOR MANUFACTURING A COMPOSITE FRICTION COMPONENT

(71) Applicants: SAFRAN CERAMICS, Le Haillan (FR); CENTRE NATIONAL DE LA RECHERCHE SCIENTIFIQUE, Paris (FR)

(72) Inventors: Eric Bouillon, Moissy-Cramayel (FR); Arnaud Delehouze, Moissy-Cramayel (FR); Amandine Lorriaux, Bordeaux (FR); Laurence Maille, Bordeaux (FR)

(73) Assignees: CENTRE NATIONAL DE LA RECHERCHE SCIENTIFIQUE, Paris (FR); SAFRAN CERAMICS, Le Haillan (FR)

(*) Notice: Subject to any disclaimer, the term of this patent is extended or adjusted under 35 U.S.C. 154(b) by 261 days.

(21) Appl. No.: 16/756,335

(22) PCT Filed: Oct. 16, 2018

(86) PCT No.: PCT/FR2018/052571
§ 371 (c)(1),
(2) Date: Apr. 15, 2020

(87) PCT Pub. No.: WO2019/077260
PCT Pub. Date: Apr. 25, 2019

(65) Prior Publication Data
US 2020/0325950 A1   Oct. 15, 2020

(30) Foreign Application Priority Data
Oct. 19, 2017   (FR) ........................ 1759873

(51) Int. Cl.
*C23C 16/04*   (2006.01)
*C23C 16/26*   (2006.01)
(Continued)

(52) U.S. Cl.
CPC ........ *F16D 69/023* (2013.01); *C04B 35/6286* (2013.01); *C04B 35/62884* (2013.01);
(Continued)

(58) Field of Classification Search
CPC ....... C23C 16/045; C23C 16/26; C23C 16/32; C23C 16/40; C23C 16/56; C23C 16/04; F16D 69/02
See application file for complete search history.

(56) References Cited

U.S. PATENT DOCUMENTS

| | | | | |
|---|---|---|---|---|
| 5,024,878 A | * | 6/1991 | Robinbrosse | ........... C04B 35/80 428/389 |
| 5,792,715 A | | 8/1998 | Duval et al. | |

(Continued)

FOREIGN PATENT DOCUMENTS

| | | |
|---|---|---|
| CN | 1887940 A | 1/2007 |
| CN | 101087739 A | 12/2007 |

(Continued)

OTHER PUBLICATIONS

International Search Report as issued in International Patent Application No. PCT/FR2018/052571, dated Jan. 17, 2019.

(Continued)

*Primary Examiner* — Elizabeth A Burkhart
(74) *Attorney, Agent, or Firm* — Pillsbury Winthrop Shaw Pittman LLP

(57) ABSTRACT

A process for manufacturing a friction component made of composite material, includes the densification of a fibrous preform of carbon yarns by a matrix including at least pyrocarbon and at least one $ZrO_xC_y$ phase, where $1 \leq x \leq 2$ and $0 \leq y \leq 1$, the matrix being formed by chemical vapor infiltration at least from a first gaseous precursor of pyrocarbon and a second gaseous precursor including zirconium, the second precursor being an alcohol or a $C_1$ to $C_6$ polyalcohol modi- (Continued)

fied by linking the oxygen atom of at least one alcohol function to a group of formula —Zr—R$_3$, the substituents R being identical or different, and R being selected from: —H, $C_1$ to $C_5$ carbon chains and halogen atoms.

10 Claims, 1 Drawing Sheet

(51) Int. Cl.
    *F16D 69/02* (2006.01)
    *C04B 35/628* (2006.01)
    *C04B 35/80* (2006.01)
    *C23C 16/32* (2006.01)
    *C23C 16/40* (2006.01)
    *C23C 16/455* (2006.01)
    *C23C 16/56* (2006.01)
    *F16D 65/12* (2006.01)

(52) U.S. Cl.
    CPC ............ *C04B 35/80* (2013.01); *C23C 16/045* (2013.01); *C23C 16/26* (2013.01); *C23C 16/32* (2013.01); *C23C 16/40* (2013.01); *C23C 16/45523* (2013.01); *C23C 16/56* (2013.01); *F16D 65/126* (2013.01); *C04B 2235/3895* (2013.01); *C04B 2235/5248* (2013.01); *C04B 2235/5256* (2013.01); *C04B 2235/614* (2013.01); *F16D 2200/0047* (2013.01); *F16D 2200/0091* (2013.01); *F16D 2250/00* (2013.01)

(56) References Cited

U.S. PATENT DOCUMENTS

| | | | |
|---|---|---|---|
| 6,009,605 | A | 1/2000 | Olry et al. |
| 6,363,593 | B1 | 4/2002 | Duval et al. |
| 2008/0282970 | A1 | 11/2008 | Heys et al. |
| 2010/0291373 | A1* | 11/2010 | Baud ............... F16D 69/023 |
| | | | 427/227 |
| 2012/0329286 | A1 | 12/2012 | Takeda et al. |
| 2016/0233085 | A1 | 8/2016 | Yamaguchi et al. |

FOREIGN PATENT DOCUMENTS

| | | |
|---|---|---|
| CN | 101886680 A | 11/2010 |
| CN | 103247689 | 8/2013 |
| EP | 2 253 604 A1 | 11/2010 |
| FR | 2 869 609 A1 | 11/2005 |
| JP | H05-024956 A | 2/1993 |
| WO | WO 2006/067184 A1 | 6/2006 |

OTHER PUBLICATIONS

Gaskell, J. M., et al., "Liquid injection MOCVD and ALD of ZrO2 using Zr-cyclopentadienyl precursors," Surface & Coatings Technology, vol. 201, No. 22-23, Aug. 2007, XP022191940, pp. 9095-9098.

* cited by examiner

PROCESS FOR MANUFACTURING A COMPOSITE FRICTION COMPONENT

CROSS-REFERENCE TO RELATED APPLICATIONS

This application is the U.S. National Stage of PCT/FR2018/052571, filed Oct. 16, 2018, which in turn claims priority to French patent application number 1759873 filed Oct. 19, 2017. The content of these applications are incorporated herein by reference in their entireties.

The invention relates to the manufacture of friction components based on carbon/carbon (C/C) composite material, such as aircraft brake discs.

BACKGROUND OF THE INVENTION

Application EP 2 253 604 proposes a process to obtain a friction component made of carbon/carbon composite (C/C) material incorporating a ceramic phase. This friction component has low wear and a coefficient of friction adapted to the braking application and stable, especially during high-energy braking.

The process disclosed in this application involves making a preform of carbon yarn, densifying the preform with a carbon matrix and, during the manufacturing process, introducing ceramic grains or particles dispersed within the component. More precisely, the application EP 2 253 604 discloses to carry out, prior to the completion of the densification, an impregnation with a liquid formed by a sol-gel type solution and/or a colloidal suspension allowing the dispersion of one or more zirconium compound(s). It is then obtained, in the final component, grains or crystallites whose composition is at least predominantly of the $ZrO_xC_y$ type with $1 \leq x \leq 2$ and $0 \leq y \leq 1$.

The friction component obtained by the process described in application EP 2 253 604 shows good performance. On the other hand, that process is more complex than the standard process for producing an all-C/C disc. Indeed, in that application, the insertion of the zirconium-based compound(s) is carried out during a liquid step, totally dissociated from the step consisting of producing pyrocarbon by gas densification (CVI).

In particular, it is disclosed in application EP 2 253 604 to carry out the insertion of zirconium, after a first step of densification with pyrocarbon by CVI. The component is then discharged from the CVI furnace and immersed in a zirconia precursor soil, dried and heat treated. The component is then reintroduced into the CVI furnace to complete the densification of the pyrocarbon matrix. This insertion of zirconium, totally dissociated from the chemical vapor infiltration process, causes complexification and lengthening of the manufacturing process.

It would be desirable to simplify the manufacturing process for friction components made of C/C composite material incorporating a zirconium ceramic phase.

SUBJECT MATTER AND SUMMARY OF THE INVENTION

The invention relates to a process for manufacturing a friction component made of composite material, comprising at least the following step:
densification of a fibrous preform of carbon yarns by a matrix comprising at least pyrocarbon (PyC) and at least one ZrOxCy phase, where $1 \leq x \leq 2$ and $0 \leq y \leq 1$, the matrix being formed by chemical vapor infiltration (CVI) at least from a first gaseous precursor of pyrocarbon and a second gaseous precursor comprising zirconium, said second precursor being an alcohol or a $C_1$ to $C_6$ polyalcohol modified by linking the oxygen atom of at least one alcohol function to a group of formula Zr—$R_3$, the substituents R being identical or different, and R being selected from: —H, $C_1$ to $C_5$ carbon chains and halogen atoms.

"Alcohol" should be understood to mean a compound with a single alcohol function. "Polyalcohol" means a compound with multiple alcohol functions.

The second precursor used here is an alcohol or a $C_1$ to $C_6$ polyalcohol functionalized, at the oxygen atom of at least one alcohol function, by a group formed by zirconium Zr to which three R substituents are bonded. The precursor has the following general formula: CH—O—Zr —$R_3$, where CH denotes the $C_1$ to $C_6$ carbon chain of the alcohol or polyalcohol, and O the oxygen atom of the alcohol function bonded to the zirconium.

The second modified precursor alcohol or polyalcohol makes it advantageous to obtain the ZrOxCy phase by using a chemical vapor infiltration process. Compared to commercial zirconium-based precursors, the second precursor has the advantage of having a decomposition temperature compatible with the temperatures conventionally used in CVI to form PyC, thus simplifying the densification process. In addition, the second precursor has a lower cost and good chemical stability compared to commercial zirconium-based precursors. In a special case, y can be 0 in the above formula if an oxidant is added in the gas phase to oxidize the carbon of the second precursor. Such an oxidant may be oxygen $O_2$ or $NO_x$. Another possibility to reduce the carbon input is to lower the CVI treatment temperature so that the carbon does not crack and remains in the gas phase.

The invention makes it possible to obtain a friction component with the desired performance in terms of tribology and wear resistance in a simpler way than in the prior art. In particular, it is possible to dispense with the steps of furnace unloading and reloading in the furnace carried out in the prior art by forming the matrix solely by CVI.

In addition, the alcohol or polyalcohol to which the zirconium is grafted is a widely available compound that can be obtained from renewable resources, thus making the second precursor described above more available than commercial zirconium precursors.

In an example embodiment, densification includes:
a first densification cycle in which a first pyrocarbon matrix phase is formed from the first precursor,
a second densification cycle, carried out after the first cycle, in which a second matrix phase comprising the ZrOxCy phase is formed at least from the second precursor, and
a third densification cycle, carried out after the second cycle, in which a third pyrocarbon matrix phase is formed from a third gaseous pyrocarbon precursor, identical or different from the first precursor.

In an example embodiment, densification comprises at least the formation of a co-deposition of pyrocarbon and the $ZrO_xC_y$ phase from a gaseous mixture of a gaseous pyrocarbon precursor and the second precursor.

In an example embodiment, R is selected from: —H, $C_1$ to $C_3$ carbon chains and halogen atoms.

In an example embodiment, at least one substituent R is a $C_1$ to $C_5$ or a $C_1$ to $C_3$ carbon chain or a halogen atom. In other words, in this case not all substituents R attached to the zirconium are —H.

In an example embodiment, the process further comprises a heat treatment for deoxygenation of the $ZrO_xC_y$ phase formed.

In an example embodiment, the $ZrO_xC_y$ phase, possibly deoxygenated, is present in the final component in a mass content of between 0.5% and 25%, for example between 2% and 10%.

In an embodiment, the friction component is a brake disc.

BRIEF DESCRIPTION OF THE DRAWINGS

Other features and advantages of the invention will be apparent from the following description, given by way of non-limiting indication, with reference to the appended drawings, wherein.

DETAILED DESCRIPTION OF EMBODIMENTS

Figures 1, 2:
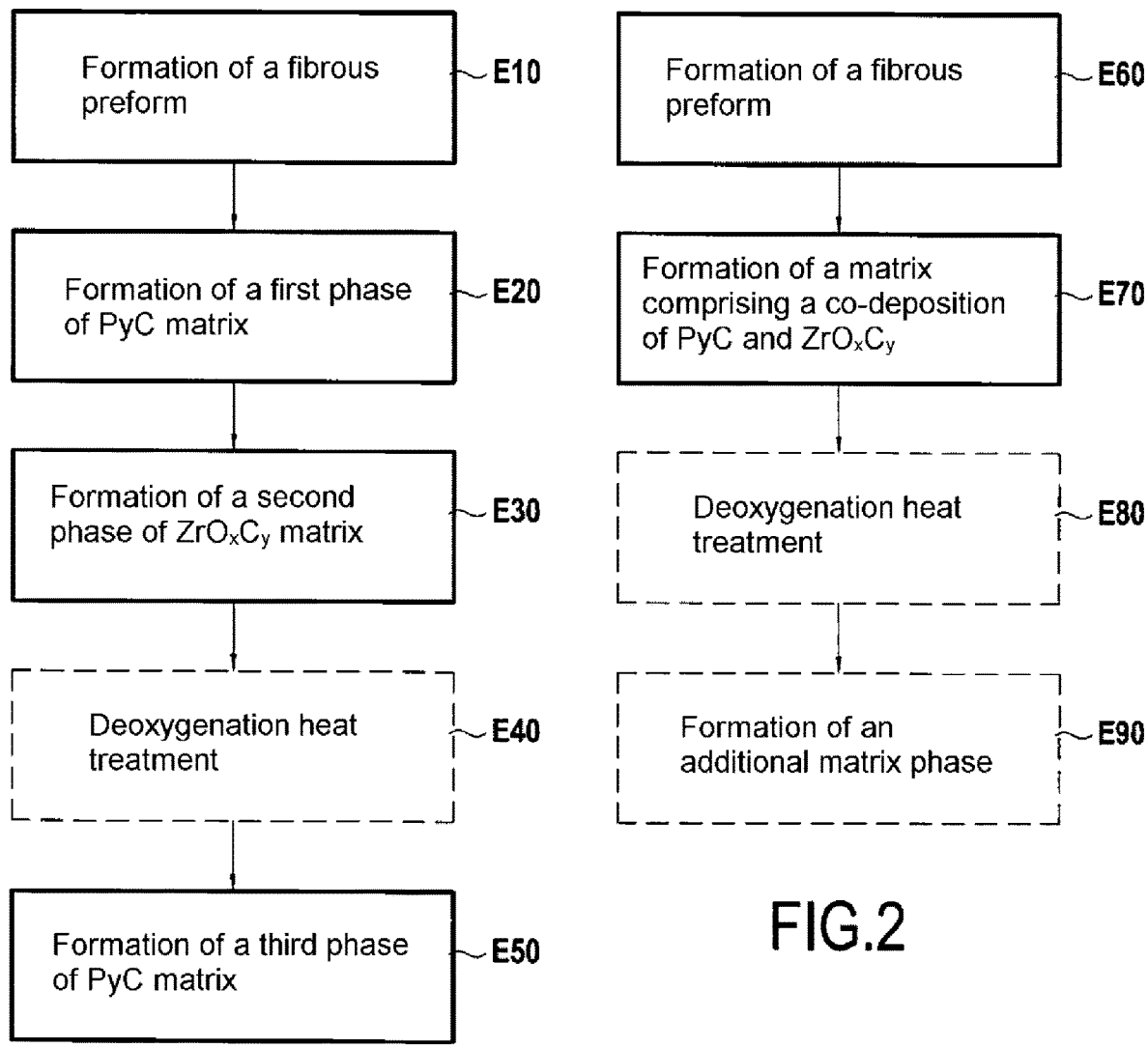
FIG. 1 is a flowchart showing different steps of a first example process according to the invention.
FIG. 2 is a flowchart showing different steps of a second process example according to the invention.

The following description more specifically considers the manufacture of discs based on C/C composite material for aircraft brakes. However, the invention is applicable to the production of other friction components based on C/C composite material, such as brake discs for land vehicles, in particular automobiles, and friction components other than discs, in particular pads.

A first example embodiment of a process according to the invention is shown in FIG. 1.

A first step consists in making a carbon yarn preform for a brake disc (step E10). Such a preform is, for example, made by superimposing layers cut from a fibrous texture in carbon precursor yarns, joining the layers together by needling and transforming the precursor into carbon by heat treatment.

Alternatively, an annular preform can also be produced by winding a helical fabric of carbon precursor yarns into superimposed turns, joining the turns together by needling and transforming the precursor by heat treatment. See for example U.S. Pat. Nos. 5,792,715, 6,009,605 and 6,363,593.

Alternatively, the preform can be made directly from layers of fibrous textured carbon yarns which are superimposed and bonded together, for example by needling.

A CVI densification is then carried out in order to densify the preform by the matrix.

For this purpose, the fibrous preform to be densified is placed in a CVI reaction vessel. A reaction vessel suitable for the formation of PyC, known per se, can be used.

In the example associated with the flowchart in FIG. 1, the densification comprises a first densification cycle in which a first PyC matrix phase is formed from the first precursor (step E20). The first PyC phase can be formed directly on the yarns forming the preform.

After the first densification cycle and before the start of the second densification cycle, a preform is obtained which is partially densified by the first PyC matrix phase. The first PyC matrix phase can occupy between 5% and 60%, for example between 10% and 30%, of the initial porosity of the fibrous preform.

A second densification cycle is then carried out during which a second matrix phase comprising the $ZrO_xC_y$ phase is formed at least from the second precursor (step E30). The second matrix phase can be formed directly on the first matrix phase PyC. According to this example, the introduction of the second gaseous precursor into the reaction vessel is initiated during the transition from the first to the second densification cycle.

According to an example, the second precursor may be the only reactive gas introduced into the reaction vessel during the second densification cycle (no PyC precursor introduced in this case). In this case, only the $ZrO_xC_y$ phase is formed during this second cycle.

Alternatively, a mixture of a PyC precursor and the second precursor may be introduced into the reaction vessel during the second densification cycle. In this case, a co-deposition of the $ZrO_xC_y$ phase and PyC is obtained. In the latter case, the PyC precursor may be the first or third precursor or a PyC precursor different from the first and third precursor. The second matrix phase may occupy between 1% and 10%, for example between 2% and 7%, of the initial porosity of the preform.

If desired, a heat treatment (optional step E40) of deoxygenation can be carried out in order to remove at least part of the existing bonds between zirconium and oxygen in the resulting $ZrO_xC_y$ phase. This treatment makes it possible to modulate the stoichiometry of this phase. In particular, after deoxygenation, the $ZrO_xC_y$ phase can be transformed into the ZrC phase. According to the example shown, the deoxygenation heat treatment is carried out after the second densification cycle and before the start of the third densification cycle.

The deoxygenation heat treatment is a treatment known per se. It is part of the general knowledge of the skilled person to determine the time and temperature to be used during this deoxygenation treatment, depending on the desired material to be obtained.

The temperature imposed during the deoxygenation treatment may be higher than the maximum temperature encountered during matrix formation.

A third densification cycle is then carried out during which a third PyC matrix phase is formed from a third gaseous PyC precursor, identical or different from the first precursor (step E50). The third matrix phase can be formed directly on the second matrix phase, optionally deoxygenated. According to this example, the introduction of the second precursor into the reaction vessel is stopped at the end of the second densification cycle and is not resumed during the third densification cycle.

The first and third precursors may, independently of each other, be selected from: natural gas, methane, propane, ethanol or a mixture of these compounds.

The second precursor is obtainable by modifying the alcohol or $C_1$ to $C_6$ polyalcohol by carrying out organic chemical reactions known to the skilled person, in order to covalently bond the oxygen atom of the alcohol function to the —Zr—$R_3$ group. This bonding can be achieved by nucleophilic substitution of the oxygen atom of the alcohol function on the zirconium.

As an example of a second usable precursor, an alcohol or a $C_1$-$C_6$ polyalcohol modified by grafting the Schwartz reagent $(C_5H_5)_2ZrHCl$ onto the oxygen in the alcohol can be used. This grafting is carried out by a nucleophilic substitution reaction by linking the oxygen of the alcohol function to the zirconium and starting the chlorine from the Schwartz reagent.

R is for each occurrence, identically or differently, —H, a $C_1$ to $C_5$ carbon chain, such as a $C_1$ to $C_5$ alkyl radical, or a halogen atom.

More particularly, R may be for each occurrence, identically or differently, —H, a $C_1$ to $C_3$ carbon chain, such as a $C_1$ to $C_3$ alkyl radical, or a halogen atom.

Even more particularly, R may be for each occurrence, identically or differently, —H, a methyl radical or a halogen atom.

In an example embodiment, the alcohol or polyalcohol is $C_2$ to $C_4$. The alcohol or polyalcohol may have a linear, branched or cyclic chain.

In an example embodiment, the alcohol or polyalcohol (before modification by zirconium bond) is selected from: methanol, ethanol, ethylene glycol, propanol, glycerol, butanol, pentanol, hexanol, cyclopropanol, cyclobutanol, cyclopentanol, cyclohexanol or a phenol. In particular, the alcohol is ethanol.

According to an example, the precursor is a modified polyalcohol and the oxygen atoms of each alcohol function may be linked to a group —Zr—$R_3$, where R is as described above, in which case the groups —Zr—$R_3$ are identical or different. Alternatively, only some of the alcohol functions may be functionalized by a —Zr—$R_3$ group.

The invention can be implemented in a known CVI installation suitable for PyC densification comprising an additional introduction line allowing the second gaseous precursor to be injected into the reaction vessel. The second precursor can be introduced into the reaction vessel by means known per se commonly used in CVI to introduce the precursor in the gaseous state.

Densification can be carried out in a reaction vessel at a temperature of about 1000° C. and a pressure preferably below 5 kPa. These conditions correspond to the temperature and pressure conditions typically used to form PyC by CVI.

In the example just described in connection with FIG. 1, the first PyC matrix phase is formed sequentially, followed by the second matrix phase comprising the $ZrO_xC_y$ phase, followed by the third PyC matrix phase. A sequenced matrix is thus obtained comprising at least a first and third PyC layer and a second layer comprising the $ZrO_xC_y$ phase interposed between the first and third layers. In a process variant not illustrated, the formation of this third matrix phase can be dispensed with. In this case, first a first PyC matrix phase is formed as described above, then a second $ZrO_xC_y$ matrix phase is formed as described above. The densification of the preform can thus be completed by the formation of this second matrix phase.

A process variant according to the invention will now be described in connection with FIG. 2.

In the example in FIG. 2, the process comprises first forming a fibrous preform (step E60) and then densifying this preform, which comprises at least the formation of a co-deposition of PyC and the $ZrO_xC_y$ phase (step E70).

In particular, $ZrO_xC_y$ inclusions distributed throughout the volume of the matrix can be obtained. These $ZrO_xC_y$ inclusions are dispersed in the pyrocarbon matrix.

The matrix formed from the first and second precursors may occupy at least 50% or even at least 75% of the initial porosity of the fibrous preform. The entire matrix can be formed by co-deposition of PyC and the $ZrO_xC_y$ phase. Thus, the preform can be fully densified by this co-deposition. Alternatively, only part of the matrix can be formed by co-deposition of PyC and the $ZrO_xC_y$ phase, the rest of the matrix having a different composition.

The co-deposit of PyC and the $ZrO_xC_y$ phase can have a uniform composition (the co-deposit has a homogeneous composition). In this case, the relative proportions between the PyC precursor gas and the second zirconium-based precursor are kept constant during co-deposition.

Alternatively, the composition of the PyC co-deposit and the $ZrO_xC_y$ phase may vary. In this case, the relative proportions between the PyC precursor gas and the second zirconium-based precursor are modified during co-deposition. This modification of the relative proportions during deposition makes it possible to locally control the proportion of the $ZrO_xC_y$ phase formed in the matrix obtained.

In a similar way to what was described above, a deoxygenation heat treatment (step E80) can be carried out after co-deposition, if desired. After this deoxygenation heat treatment E80, densification with an additional matrix phase E90 can optionally be carried out. The additional matrix phase can for example be PyC.

The details described above relating to the fibrous preform, the precursors of PyC and $ZrO_xC_y$, and the CVI operating conditions remain applicable to the example in FIG. 2.

The relative proportions between the injected PyC precursor(s) and the second injected $ZrO_xC_y$ precursor determine the mass content of the resulting $ZrO_xC_y$ phase in the final component. In particular, it is possible to obtain in the final component a content of between 0.5% and 25%, or even between 2% and 10%, for the $ZrO_xC_y$ phase, this phase may or may not have undergone the deoxygenation treatment mentioned above.

The phrase "between . . . and . . . " should be understood to include the bounds.

The invention claimed is:

1. A process for manufacturing a friction component of composite material, comprising:
   densification of a fibrous preform of carbon yarns by a matrix comprising at least pyrocarbon and at least one $ZrO_xC_y$ phase, where $1 \leq x \leq 2$ and $0 \leq y \leq 1$, the matrix being formed by chemical vapor infiltration at least from a first gaseous precursor of pyrocarbon and a second gaseous precursor comprising zirconium, said second precursor being an alcohol or a $C_1$ to $C_6$ polyalcohol, which alcohol or a $C_1$ to $C_6$ polyalcohol is modified by linking the oxygen atom of at least one alcohol function to a group of formula —Zr—$R_3$, the substituents R being identical or different, and R being selected from: —H, $C_1$ to $C_5$ carbon chains and halogen atoms.

2. The process claimed in claim 1, wherein the densification comprises:
   a first densification cycle in which a first pyrocarbon matrix phase is formed from the first precursor,
   a second densification cycle, carried out after the first cycle, in which a second matrix phase comprising the $ZrO_xC_y$ phase is formed at least from the second precursor, and
   a third densification cycle, carried out after the second cycle, in which a third pyrocarbon matrix phase is formed from a third gaseous pyrocarbon precursor, identical or different from the first precursor.

3. The process claimed in claim 1, wherein the densification comprises at least the formation of a co-deposition of the pyrocarbon phase and the $ZrO_xC_y$ phase from a gaseous mixture of a gaseous pyrocarbon precursor and the second precursor.

4. The process as claimed in claim 1, wherein R is selected from: —H, $C_1$ to $C_3$ carbon chains and halogen atoms.

5. The process as claimed in claim 1, wherein at least one substituent R is a $C_1$ to $C_5$ or $C_1$ to $C_3$ carbon chain or a halogen atom.

6. The process as claimed in claim 1, wherein the process further comprises a deoxygenation heat treatment of the $ZrO_xC_y$ phase formed.

7. The process as claimed in claim 1, wherein the $ZrO_xC_y$ phase, optionally deoxygenated, is present, in the final component, in a mass content of between 0.5% and 25%.

8. The process claimed in claim 7, wherein the $ZrO_xC_y$ phase, optionally deoxygenated, is present, in the final component, in a mass content of between 2% and 10%.

9. The process as claimed in claim 1, wherein the friction component is a brake disc.

10. The process as claimed in claim 1, wherein the $C_1$ to $C_6$ polyalcohol is modified by linking the oxygen atom of each alcohol function to said group of formula —Zr—$R_3$.

* * * * *